United States Patent [19]
Nakatsu

[11] Patent Number: 6,081,540
[45] Date of Patent: Jun. 27, 2000

[54] SEMICONDUCTOR LIGHT EMITTING DEVICE WITH HIGH LIGHT EMISSION EFFICIENCY

[75] Inventor: Hiroshi Nakatsu, Tenri, Japan

[73] Assignee: Sharp Kabushiki Kaisha, Osaka, Japan

[21] Appl. No.: 08/992,635

[22] Filed: Dec. 18, 1997

[30] Foreign Application Priority Data

Dec. 20, 1996 [JP] Japan .................................... 8-341085

[51] Int. Cl.$^7$ ...................................................... H01S 3/19
[52] U.S. Cl. ............................................. 372/45; 257/103
[58] Field of Search ............................... 372/45; 257/79, 257/94, 102, 103

[56] References Cited

U.S. PATENT DOCUMENTS 6,015,719  1/2000  Kish, Jr. et al. ........................... 257/94

FOREIGN PATENT DOCUMENTS

| 0617470 A2 | 9/1994 | European Pat. Off. . |
| 5-175551 | 7/1993 | Japan . |
| 6-260680 | 9/1994 | Japan . |

OTHER PUBLICATIONS

H. Sugawara et al, "High–brightness IN GaAlP green light–emitting diodes", Appl. Phys. Lett., vol. 61, No. 15, Oct. 12, 1992, pp. 1775–1777.

F. A. Kish, et al, "Very high–efficiency semiconductor water–bonded transparent substrate $(Al_x Ga_{1-x})_{0.5} In_{0.5} P$/GaP light–emitting diodes", Appl. Phys. Lett. vol. 64, No. 21, May 23, 1994, pp. 2839–2841.

Torchinskaya et al, "Transformation of Deep Centers during Degradation of GaP:N/GaP:Zn:O Light–Emitting Diodes", Sov.Phys. Semicond. 20(4), Apr. 1986, pp. 442–446.

Sturge, "A New Interimpurity Recombination in GaP; Revised Values for Acceptor Binding Energies", Appl. Phys. Lett. 32(1), Jan. 1, 1978, pp. 49–51.

Bhargava et al, "Mg–O Complexes in GaP–A Yellow Diode", Appl. Phys. Lett., vol. 20, No. 6, Mar. 15, 1972, pp. 227–229.

Scott, "Excitation Spectra of Shallow Donors in GaP", Journal of Applied Physics, vol. 48, No., Jul. 1977, pp. 3173–3175.

*Primary Examiner*—James W. Davie
*Attorney, Agent, or Firm*—Nixon & Vanderhye P.C.

[57] ABSTRACT

The invention provides a semiconductor light emitting device in which a light emitting layer is formed on a semiconductor substrate in a state of lattice mismatching with this semiconductor substrate, and by which light emission of high efficiency is obtained. A semiconductor material used as a base material of the light emitting layer is doped with impurities serving as radiative recombination centers. The semiconductor substrate is a GaP substrate and the semiconductor material as the base material of the light emitting layer is $(Al_x Ga_{1-x})_{1-y} In_y P$. This $(Al_x Ga_{1-x})_{1-y} In_y P$ material is doped with nitrogen, oxygen, selenium, sulfur or tellurium as a first impurity for forming a donor level, and also with magnesium, zinc or cadmium as a second impurity for forming an acceptor level.

20 Claims, 6 Drawing Sheets

Fig.6 PRIOR ART
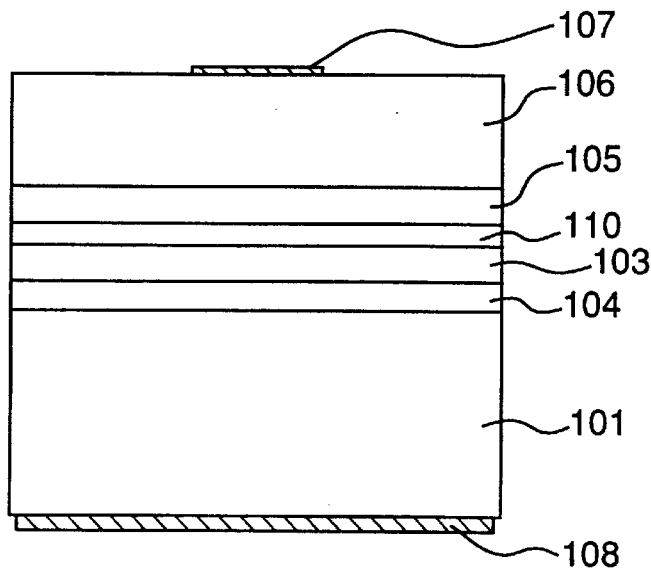
Fig.7A PRIOR ART
Fig.7B PRIOR ART
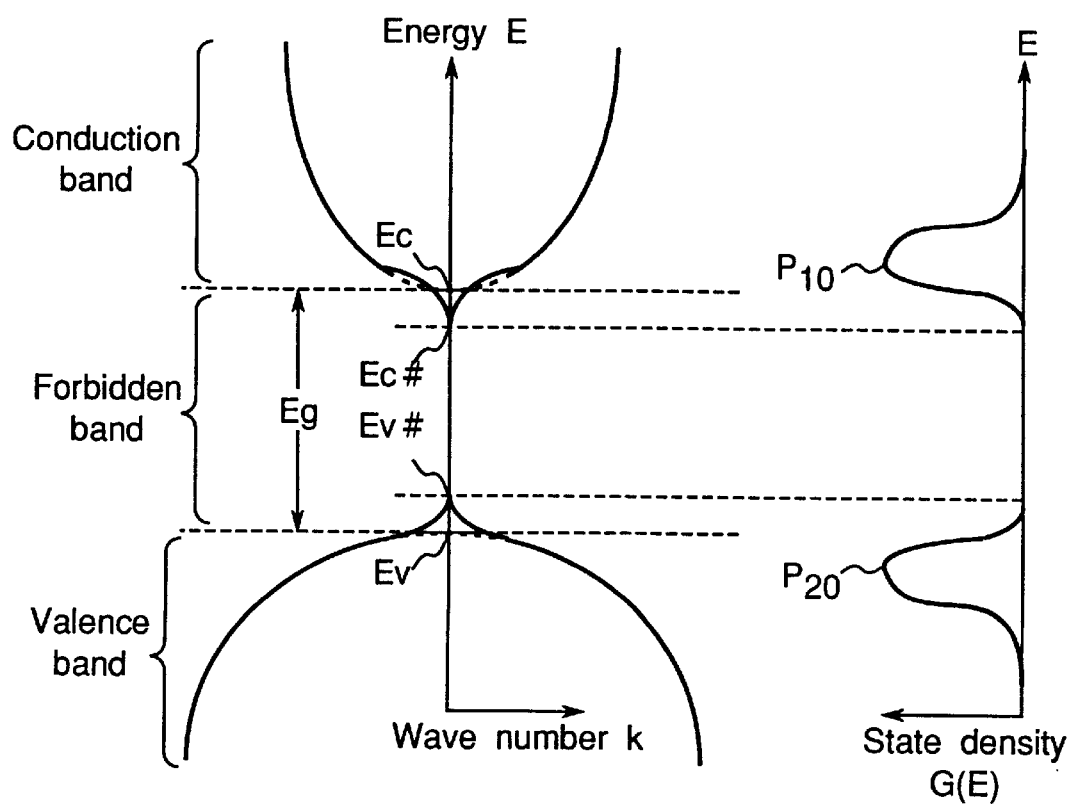

Fig.8 PRIOR ART
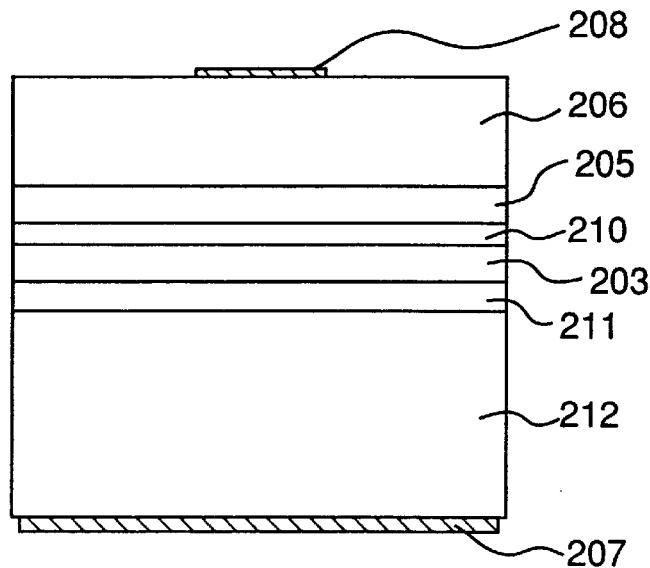
Fig.9A PRIOR ART
Fig.9B PRIOR ART
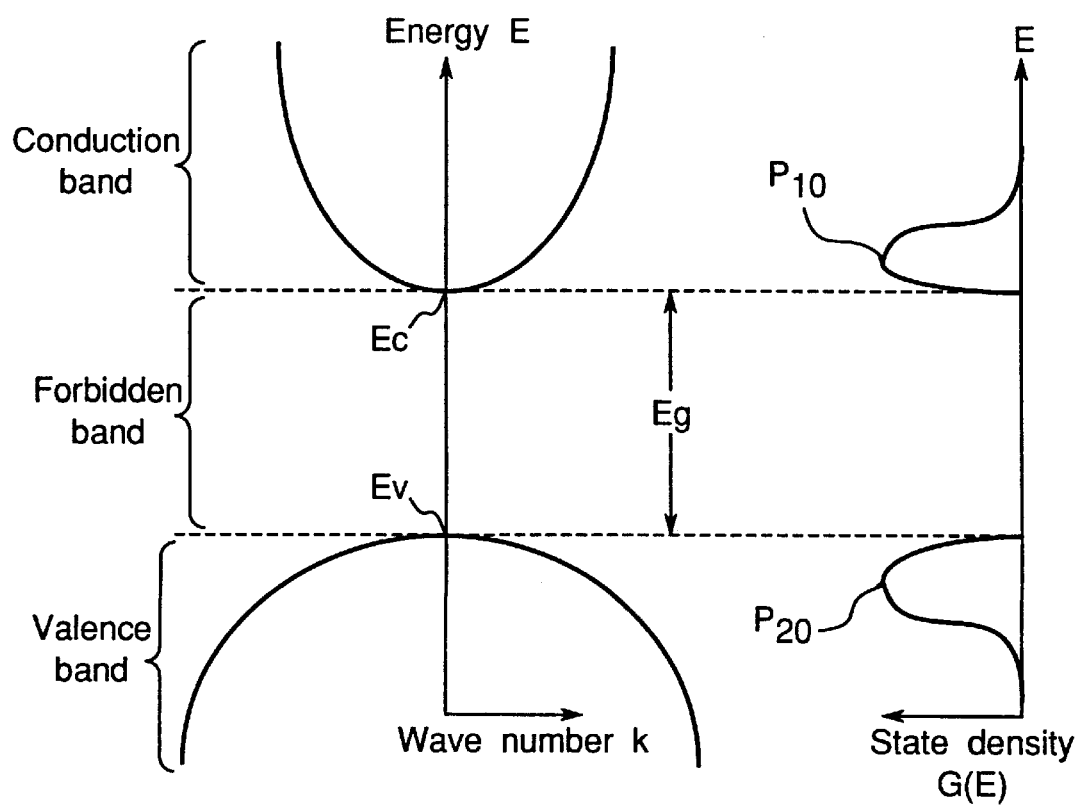

SEMICONDUCTOR LIGHT EMITTING DEVICE WITH HIGH LIGHT EMISSION EFFICIENCY

BACKGROUND OF THE INVENTION

The present invention relates to a semiconductor light emitting device. Typically, the invention relates to a light emitting diode having a light emitting layer made of AlGaInP materials.

It is noted that the term "AlGaInp materials" herein refers to those in which mixed crystal ratios x, y of $(Al_xGa_{1-x})_{1-y}In_yP$ are changed in the ranges of $0 \leq x$, $y \leq 1$.

The $(Al_xGa_{1-x})_{1-y}In_yP$ material exhibits lattice matching with a GaAs substrate at an In mixed crystal ratio of y=0.51. Moreover, at the In mixed crystal ratio of y=0.51, the material turns to the direct transition type with the Al mixed crystal ratio in the range of x=0–0.7, where light emission of high brightness can be obtained over a wide wavelength region from red to green. As a result, the $(Al_xGa_{1-x})_{1-y}In_yP$ material has recently begun to be widely used as a material of light emitting diodes. As such an $(Al_xGa_{1-x})_{1-y}In_yP$ family light emitting diode, for example as shown in FIG. 8, there has been known one in which an n-type GaAs buffer layer 211, an n-type $(Al_xGa_{1-x})_{1-y}In_yP$ clad layer 203, a non-doped $(Al_xGa_{1-x})_{1-y}In_yP$ active layer 210, a p-type $(Al_xGa_{1-x})_{1-y}In_yP$ clad layer 205 and a p-type GaP current spreading layer 206 are stacked one after another on an n-type GaAs substrate 212. In order to effectively entrap injection carriers into the active layer 210, the band gap of the clad layers 203, 205 is set larger than that of the active layer 210 (DH (double hetero) structure). In addition, an n-side electrode 207 is provided on a bottom surface of the GaAs substrate 212, and a p-side electrode 208 is provided on a top surface of the current diffused layer 206. Since the In mixed crystal ratio y is set to y=0.51, which falls in the lattice matching with the GaAs substrate, the crystallinity of the $(Al_xGa_{1-x})_{1-y}In_yP$ materials (active layer 210 and clad layers 203, 205) that contributes to the light emission becomes better. As a result of this, as can be understood from an energy band view of FIG. 9A, the vicinity of the bottom (energy value Ec) of the conduction band of the active layer 210 and the vicinity of the top (energy value Ev) of the valence band are both parabolically shaped, and as shown in FIG. 9B, peaks $P_{10}$, $P_{20}$ of the state density G(E) of carriers in the conduction band and the valence band are approximate to band ends Ec, Ev of these bands, respectively. Therefore, the $(Al_xGa_{1-x})_{1-y}In_yP$ active layer 210 itself is enabled to exhibit a relatively high internal quantum efficiency (which refers to an efficiency at which electricity is converted into light at around p-n junctions).

However, with the structure of FIG. 8, since the band gap of the GaAs substrate 212 is 1.42 eV, emitted light of red to green is absorbed, so that light output would lower to less than a half, as a problem. In the case where light emitting material is made from GaP, GaAsP, AlGaAs or the like, since the GaAs substrate is transparent to the light emission wavelengths, there has been no possibility of occurrence of a problem due to light absorption by the substrate. However, in the case where the light emitting material is made from $(Al_xGa_{1-x})_{1-y}In_yP$, such light absorption by the substrate would occur as far as a GaAs substrate is used, so that external quantum efficiency thereof (which refers to an efficiency at which light is taken out externally; sometimes, referred to simply as "efficiency" or "light emission efficiency") would lower.

To avoid the light absorption by the substrate, there has been proposed a light emitting diode, as shown in FIG. 10, in which an n-type GaAs buffer layer 311, an n-type distributed Bragg reflection (DBR) layer 313, an n-type $(Al_xGa_{1-x})_{1-y}In_yP$ clad layer 303, a non-doped $(Al_xGa_{1-x})_{1-y}In_yP$ active layer 310, a p-type $(Al_xGa_{1-x})_{1-y}In_yP$ clad layer 305 and a p-type GaP current spreading layer 306 are stacked one after another on an n-type GaAs substrate 301 (Appl. Phys. Lett., vol. 61, No. 15 (1992), pp. 1775–1777). In this light emitting diode, the DBR layer 313 formed by alternately combining two types of semiconductor layers of different refractive indexes in appropriate layer thickness is provided between the GaAs substrate 301 and the n-type clad layer 303 so that light emitted by the active layer 310 will be reflected upward by the DBR layer 313 so as not to reach the GaAs substrate 301 side. Further, there has been proposed a light emitting diode, as shown in FIG. 11, which has been fabricated through the steps of stacking an n-type $(Al_xGa_{1-x})_{1-y}In_yP$ clad layer 403, a non-doped $(Al_xGa_{1-x})_{1-y}In_yP$ active layer 410, a p-type $(Al_xGa_{1-x})_{1-y}In_yP$ clad layer 405 and a p-type GaP current spreading layer 406 one after another on an unshown GaAs substrate, removing the GaAs substrate by etching and then joining a GaP substrate (with band gap 2.27 eV) 414, transparent to light emission wavelengths of red to green, with an exposed surface (junction part) 420 of the clad layer 403 (Appl. Phys. Lett., vol. 64, No. 21 (1994), pp. 2839–2841).

However, with the light emitting diode of FIG. 10, all of the light emitted downward from the active layer 310 could not be reflected by the DBR layer 313, so that part of the light will be transmitted by the DBR layer 313 and absorbed by the GaAs substrate 301. As a result, this light emitting diode could only be enhanced in light emission efficiency to around 1.5 times that of the light emitting diode of FIG. 8.

Meanwhile, the light emitting diode of FIG. 11 would encounter a difficulty in the technique of joining the GaP substrate 414, being unsuitable for mass production.

Under these backgrounds, there has been thought hitherto a means of growing the $(Al_xGa_{1-x})_{1-y}In_yP$ material not on a GaAs substrate but on a substrate which is transparent to emission light wavelengths (650–550 nm) of the $(Al_xGa_{1-x})_{1-y}In_yP$ material, typically on the aforementioned GaP substrate (with band gap 2.27 eV). That is, as shown in FIG. 6, there has been thought a light emitting diode in which an n-type GaInP buffer layer 104, an n-type $(Al_xGa_{1-x})_{1-y}In_yP$ clad layer 103, a non-doped $(Al_xGa_{1-x})_{1-y}In_yP$ active layer 110, a p-type $(Al_xGa_{1-x})_{1-y}In_yP$ clad layer 105 and a p-type GaP current spreading layer 106 are grown on an n-type GaP substrate 101.

However, as shown in FIG. 5, in the vicinity of a GaP lattice constant of 5.451 Å, there exists no region that permits direct transition of the $(Al_xGa_{1-x})_{1-y}In_yP$ material. Therefore, even if the $(Al_xGa_{1-x})_{1-y}In_yP$ material showing lattice matching with the GaP substrate has been grown on the GaP substrate 101, light emission of high efficiency can not be expected. On the other hand, due to the fact that the lattice constant 5.653 Å of the GaAs substrate is about 3.6% greater than the lattice constant 5.451 Å of the GaP substrate, when the $(Al_xGa_{1-x})_{1-y}In_yP$ materials 103, 110 and 105 showing lattice matching with the GaAs substrate have been grown on the GaAs substrate 101, so-called misfit dislocations (dislocations due to lattice mismatching) would increase in the grown $(Al_xGa_{1-x})_{1-y}In_yP$ materials 103, 110 and 105 so that non-radiative recombination centers would increase with the transition probability of light emission reduced, even though the GaInP buffer layer 104 is interveniently provided so as to relieve the lattice constant difference. That is, because crystals of different lattice constants are grown on the substrate, there would occur a disturbance in the periodicity of the grown crystal lattice so that a definite forbidden band can not exist. As a result of this, as shown in FIG. 7A, neither the vicinity of the bottom (Ec) of the conduction band of the active layer 110 nor the vicinity of the top (Ev) of the valence band is parabolically shaped, but each of them has a tail of about several tens meV so that, as shown in FIG. 7B, tip ends Ec#, Ev# of the tails (not necessarily definite in position) fall away from the peaks $P_{10}$, $P_{20}$ of the state density G(E) of carriers in the conduction band and the valence band, respectively. As a result of this, injected carriers are unlikely to recombine in the vicinity of the band ends Ec, Ev, so that the transition probability of light emission becomes smaller. Therefore, for the direct transition type light emitting diode that has been fabricated by growing on the GaP substrate 101 the $(Al_xGa_{1-x})_{1-y}In_yP$ materials 103, 110 and 105 showing lattice matching with the GaAs substrate, it would be difficult to obtain light emission of high efficiency. Actually, its light emission efficiency would lower by two orders or more, compared with the light emitting diode of FIG. 8.

Thus, even if the semiconductor substrate is transparent to the light emission wavelengths, a semiconductor light emitting device in which a light emitting layer (active layer) is grown in a state of lattice mismatching with the semiconductor substrate has a problem that light emission of high efficiency can not be obtained.

SUMMARY OF THE INVENTION

An object of the present invention is therefore to provide a semiconductor light emitting device in which a light emitting layer (active layer) is formed on a semiconductor substrate in a state of lattice mismatching with this semiconductor substrate, and by which light emission of high efficiency can be obtained.

In particular, an object of the present invention is to provide a semiconductor light emitting device in which a light emitting layer originating from a parent material of $(Al_xGa_{1-x})_{1-y}In_yP$ materials is formed on a GaP substrate, and by which light emission of high efficiency can be obtained over the wavelength region of red to green.

In order to achieve the aforementioned object, the present invention provides a semiconductor light emitting device in which a light emitting layer that emits light of wavelengths which is not substantially absorbed by a semiconductor substrate is formed on the semiconductor substrate in a state of lattice mismatching with the semiconductor substrate, characterized in that a semiconductor material used as a base material of the light emitting layer is doped with at least one impurity serving as a radiative recombination center.

In the semiconductor light emitting device of the present invention, the impurity serving as a radiative recombination center is enabled to form an impurity level at a position distant from an end of a forbidden band of the semiconductor material used as the base material of the light emitting layer and in the forbidden band. In this case, even if the band end of the semiconductor material used as the base material of the light emitting layer has a tail due to the lattice mismatching with the semiconductor substrate, the radiative recombination through the impurity level is unlikely to be affected by the tail. Therefore, the internal quantum efficiency is enhanced. Also, light emitted by the light emitting layer is not substantially absorbed by the semiconductor substrate, that is, there does not occur such light absorption as would cause a transition from the top of the valence band to the bottom of the conduction band in the semiconductor substrate, so that the external quantum efficiency does not lower, either. Therefore, the light emission efficiency as a whole is enhanced.

In an embodiment, the light emitting layer contains two kinds of the impurities comprising a first impurity for forming a donor level and a second impurity for forming an acceptor level.

In the semiconductor light emitting device of this embodiment, radiative recombination occurs between the donor level formed by the first impurity and the acceptor level formed by the second impurity. Therefore, the internal quantum efficiency becomes higher than it is when only either one of the first impurity or the second impurity is contained, so that the light emission efficiency as a whole is further enhanced.

In an embodiment, the donor level formed by the first impurity is positioned within a range of 30 meV to 200 meV from an end of a conduction band of the semiconductor material used as the base material, and the acceptor level formed by the second impurity is positioned within a range of 30 meV to 200 meV from an end of a valence band of the semiconductor material used as the base material.

In this case, an end of the conduction band and an end of the valence band of the semiconductor material used as the base material of the light emitting layer refer to an end of the conduction band and an end of the valence band, respectively, in the case where the light emitting layer is formed in a lattice matching with the semiconductor substrate. That is, the donor level formed by the first impurity and the acceptor level formed by the second impurity are defined by referring to original band ends of the semiconductor material used as the base material.

In the semiconductor light emitting device of this embodiment, the donor level formed by the first impurity is distant over 30 meV from the end of the conduction band of the semiconductor material used as the base material, and the acceptor level formed by the second impurity is distant over 30 meV from the end of the valence band of the semiconductor material used as the base material. As a result, even if the end of the conduction band and the end of the valence band of the semiconductor material used as the base material each have a tail of about several tens meV due to the lattice mismatching between the semiconductor substrate and the light emitting layer, the radiative recombination between the donor level formed by the first impurity and the acceptor level formed by the second impurity is hardly affected by the tails. Also, the donor level formed by the first impurity is positioned within 200 meV from the end of the conduction band of the semiconductor material used as the base material, and the acceptor level formed by the second impurity is positioned within 200 meV from the end of the valence band of the semiconductor material used as the base material. Therefore, these first and second impurities work effectively as radiative recombination centers, respectively. Accordingly, the internal quantum efficiency is further enhanced by the radiative recombination between the donor level formed by the first impurity and the acceptor level formed by the second impurity. As a consequence of this, the light emission efficiency as a whole is further enhanced.

The present invention provides a semiconductor light emitting device in which a light emitting layer including an AlGaInP material as a base material is grown on a GaP substrate in a state of lattice mismatching with the GaP substrate, characterized in that the AlGaInP material used as the base material of the light emitting layer is doped with nitrogen, oxygen, selenium, sulfur or tellurium as a first impurity for forming a donor level, and magnesium, zinc or cadmium as a second impurity for forming an acceptor level.

In the semiconductor light emitting device of the present invention, nitrogen, oxygen, selenium, sulfur or tellurium as the first impurity forms a donor level within a range of 30 meV to 200 meV from the end of the conduction band of the AlGaInP material used as the base material, while magnesium, zinc or cadmium forms an acceptor level within a range of 30 meV to 200 meV from the end of the valence band of the AlGaInP material used as the base material. The donor level formed by the first impurity is distant over 30 meV from the end of the conduction band of the AlGaInP material used as the base material, and the acceptor level formed by the second impurity is distant over 30 meV from the end of the valence band of the AlGaInP material used as the base material. Therefore, even if the end of the conduction band and the end of the valence band of the AlGaInP material used as the base material each have a tail of about several tens meV due to the lattice mismatching between the GaP substrate and the light emitting layer, the radiative recombination between the donor level formed by the first impurity and the acceptor level formed by the second impurity is hardly affected by the tails. Also, the donor level formed by the first impurity is positioned within 200 meV from the end of the conduction band of the AlGaInP material used as the base material, and the acceptor level formed by the second impurity is positioned within 200 meV from the end of the valence band of the AlGaInP material used as the base material. Therefore, these first and second impurities work effectively as radiative recombination centers, respectively. Accordingly, the internal quantum efficiency is enhanced by the radiative recombination between the donor level formed by the first impurity and the acceptor level formed by the second impurity. Further, light of wavelengths from red to green emitted by the light emitting layer responsive to the energy gap between the donor level formed by the first impurity and the acceptor level formed by the second impurity is not substantially absorbed by the GaP substrate (the GaP substrate is transparent to the emission light wavelengths of the AlGaInP material, 650 nm to 550 nm). Therefore, the external quantum efficiency will not lower, either. Consequently, the light emission efficiency as a whole is enhanced, and light emission of high brightness can be obtained in the wavelength band of red to green.

BRIEF DESCRIPTION OF THE DRAWINGS

The present invention will become more fully understood from the detailed description given hereinbelow and the accompanying drawings which are given by way of illustration only, and thus are not limitative of the present invention, and wherein:

FIG. 6 is a structural view of a light emitting diode on a GaP substrate;

FIGS. 7A and 7B are views showing a band state and a state density distribution of carriers in the light emitting diode on a GaP substrate;

FIG. 8 is a structural view of a light emitting diode according to the prior art;

FIGS. 9A and 9B are a band state view and a view showing a state density distribution of carriers in the light emitting diode according to the prior art;

DETAILED DESCRIPTION OF THE PREFERRED EMBODIMENTS

Hereinbelow, embodiments of the present invention are described in detail.

(First Embodiment)

Figure 1:
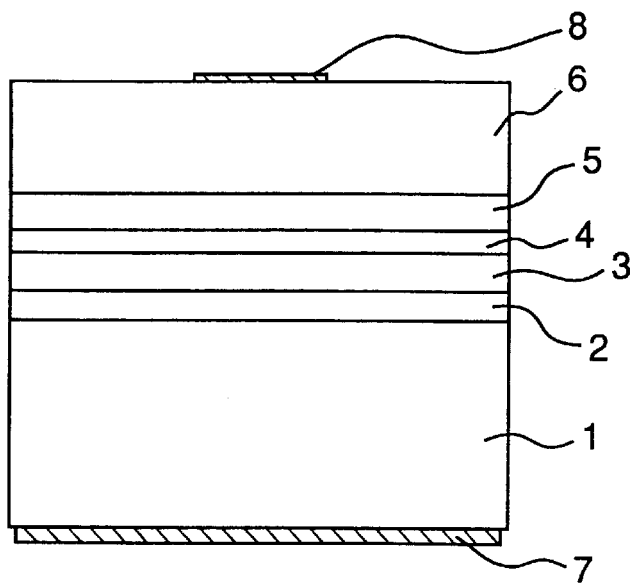
FIG. 1 is a structural view according to a first embodiment of the present invention.

FIG. 1 shows a cross-sectional structure of an AlGaInP light emitting diode according to a first embodiment of the present invention. This light emitting diode is formed through the steps of: making an n-type InGaP buffer layer 2, a Si doped $(Al_xGa_{1-x})_{1-y}In_yP$ (x=1.0, y=0.51) clad layer 3, a nitrogen-zinc doped $(Al_xGa_{1-x})_{1-y}In_yP$ (x=0.5, y=0.51) active layer 4 as a light emitting layer, a Zn doped $(Al_xGa_{1-x})_{1-y}In_yP$ (x=1.0, y=0.51) clad layer 5 and a Zn doped GaP current spreading layer 6 grown one after another on an n-type GaP substrate 1 having a plane tilted 15° from the (001) plane in the [110] direction, for example, by MOCVD (Metal Organic Chemical Vapor Deposition) process; and thereafter providing an n-side electrode 7 on the bottom surface of the GaP substrate 1 and a p-side electrode 8 on the top surface of the current spreading layer 6, respectively. Although a 15° off substrate 1 has been employed, a (100) plane just substrate also will do. The doping concentration of impurities into the $(Al_xGa_{1-x})_{1-y}In_yP$ material used as the base material of the active layer 4 is within a range of $1\times10^{17}$–$1\times10^{19}$ cm$^{-3}$ for nitrogen as the first impurity that forms the donor level, and $1\times10^{17}$–$1\times10^{18}$ cm$^{-3}$ for Zn as the second impurity that forms the acceptor level.

Figure 2A:
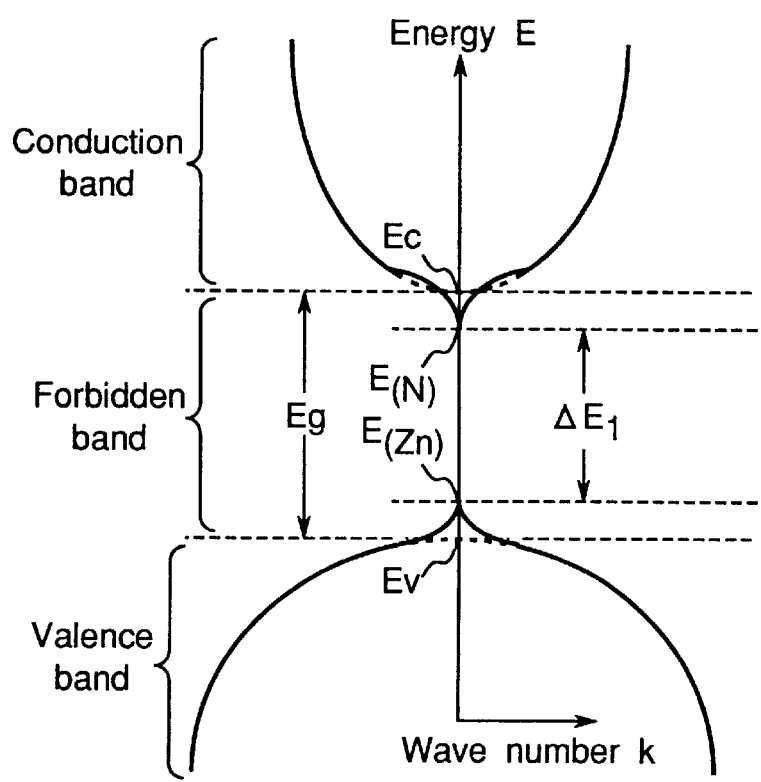
FIGS. 2A and 2B are a band state view and a view showing a state density distribution of carriers according to the first embodiment of the invention.
Figure 2B:
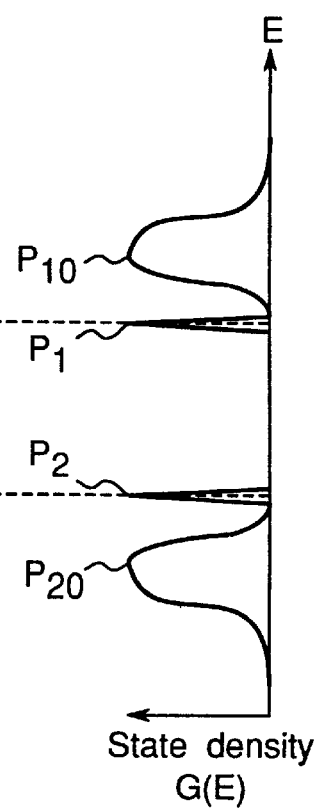

Since the $(Al_xGa_{1-x})_{1-y}In_yP$ materials 3, 4 and 5 are grown in a state of lattice mismatching on the GaP substrate 1, neither the vicinity of the bottom (energy value Ec) of the conduction band nor the vicinity of the top (energy value Ev) of the valence band of the active layer 4 would become parabolic shaped but each of them has a tail of about several tens meV as shown in the energy band view of FIG. 2A, so that tip ends (not necessarily definite in position) of the tails fall away from peaks $P_{10}$, $P_{20}$ of the state density G(E) of carriers in the conduction band and the valence band as shown in FIG. 2B. For this reason, the transition probability of normal light emission at band ends is relatively small.

With this light emitting diode, however, in the active layer 4, nitrogen as the first impurity forms a donor level $E_{(N)}$ at a position 30 meV distant from the end (bottom) Ec of the conduction band of the base material $(Al_xGa_{1-x})_{1-y}In_yP$ (x=0.5, y=0.51), and zinc as the second impurity forms an acceptor level $E_{(Zn)}$ at a position 60 meV distant from the end (top) of the valence band of the base material $((Al_xGa_{1-x})_{1-y}In_yP$ (x=0.5, y=0.51) ($P_1$, $P_2$ in FIG. 2B show peaks of state density G(E) corresponding to these donor level $E_{(N)}$ and acceptor level $E_{(Zn)}$, respectively). The donor level $E_{(N)}$ formed by nitrogen and the acceptor level $E_{(Zn)}$ formed by zinc are distant more than 30 meV from the band ends Ec and Ev, respectively, so that radiative recombination between the donor level $E_{(N)}$ formed by nitrogen and the acceptor level $E_{(Zn)}$ formed by zinc will hardly be affected by the tails. Also, since the donor level $E_{(N)}$ formed by nitrogen and the acceptor level $E_{(Zn)}$ formed by zinc are positioned within 200 meV from the band ends Ec and Ev, respectively, these nitrogen and zinc will effectively work each as a radiative recombination center. Therefore, the internal quantum efficiency is enhanced by the radiative recombination between the donor level $E_{(N)}$ formed by nitrogen and the acceptor level $E_{(Zn)}$ formed by zinc. Although the active layer 4 emits light of a wavelength corresponding to an energy gap $\Delta E_1$ between the donor level $E_{(N)}$ formed by nitrogen and the acceptor level $E_{(Zn)}$ formed by zinc, the light emitted by the active layer 4 will not be substantially absorbed by the GaP substrate 1 (because the GaP substrate is transparent to the light emission wavelengths of AlGaInP materials, 650 nm–550 nm), so that the external quantum efficiency will not lower, either. Consequently, the light emission efficiency as a whole can be enhanced.

Actually, with the light emitting diode of this first embodiment, the light emission wavelength became 574 nm in response to an energy gap $\Delta E_1$=2.16 eV between the donor level $E_{(N)}$ formed by nitrogen and the acceptor level $E_{(Zn)}$ formed by zinc. In this case, a light emission efficiency of 1.0% was able to be obtained. In contrast to this, with the light emitting diode of lattice matching type in which AlGaInp materials are grown on a GaAs substrate as shown in FIG. 8, the light emission wavelength would be 550 nm in response to a band gap Eg (=2.25 eV) with the mixed crystal ratios of x=0.5, y=0.51 of the non-doped $(Al_xGa_{1-x})_{1-y}In_yP$ active layer 210. In this case, the resulting light emission efficiency is 0.1%. Therefore, in a comparison with the same mixed crystal ratios x, y of the active layer, the light emitting diode having the structure of the first embodiment has found that the light emission efficiency can be enhanced tenfold as compared with the light emitting diode of FIG. 8. Also, with the light emitting diode of lattice matching type in which AlGaInp materials are grown on a GaAs substrate as shown in FIG. 8, when the non-doped $(Al_xGa_{1-x})_{1-y}In_yP$ active layer 210 has mixed crystal ratios of x=0.38, y=0.51, the light emission wavelength would be 572 nm correspondingly. In this case, the resulting light emission efficiency is 0.35%. Therefore, in a comparison on the condition of generally equal light emission wavelengths, the light emitting diode having the structure of the first embodiment has found that the light emission efficiency can be enhanced about threefold as compared with the light emitting diode of FIG. 8.

Figure 5:
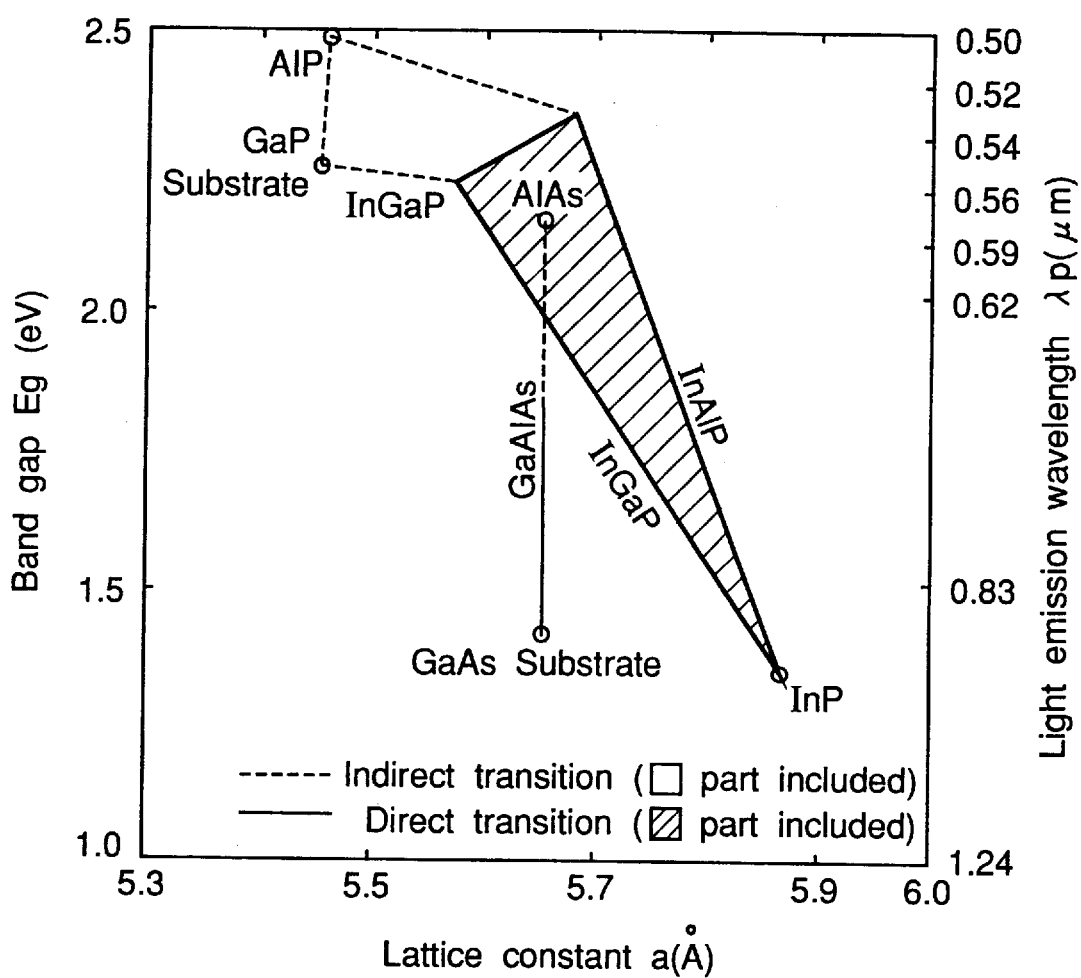
FIG. 5 is a chart of the relationship between lattice constant and energy gap of the semiconductor material of the light emitting layer and the substrate.
Figure 10:
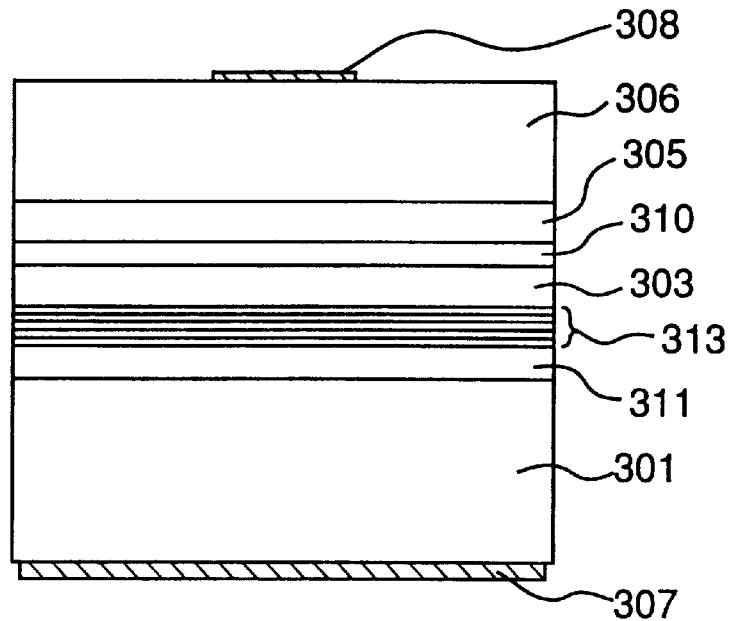
FIG. 10 is a structural view of a light emitting diode according to the prior art.
Figure 11:
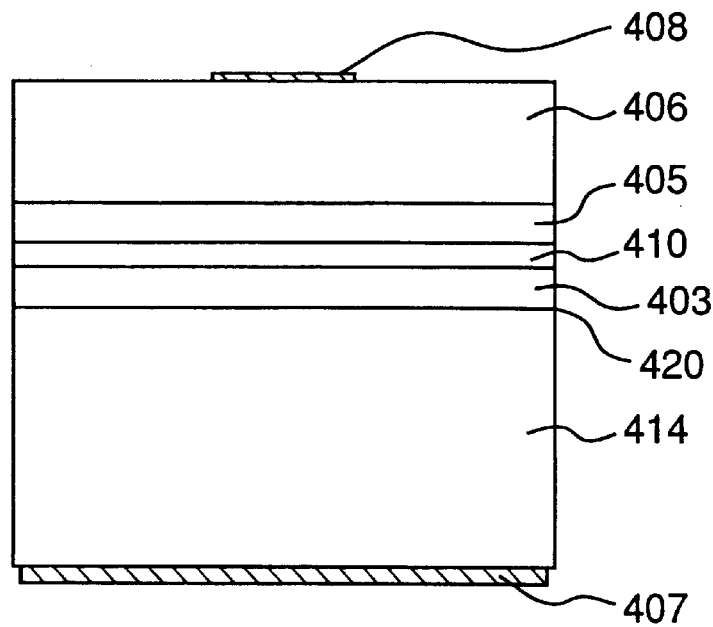
FIG. 11 is a structural view of a light emitting diode according to the prior art.

Doping nitrogen in the active layer 4 is advantageous also in terms of wavelength shortening. This is because even when the active layer 4 is increased in Al mixed crystal ratio as large as x=0.75 to enter the indirect transition region (see FIG. 5), an isoelectronic level is formed by the doping of nitrogen, resulting in direct transition, so that the transition probability of light emission is enhanced. Actually, under the conditions of x=0.75, y=0.51, a light emission efficiency of 0.2% was obtained with light emission wavelength 555 nm.

(Second Embodiment)

Figure 3:
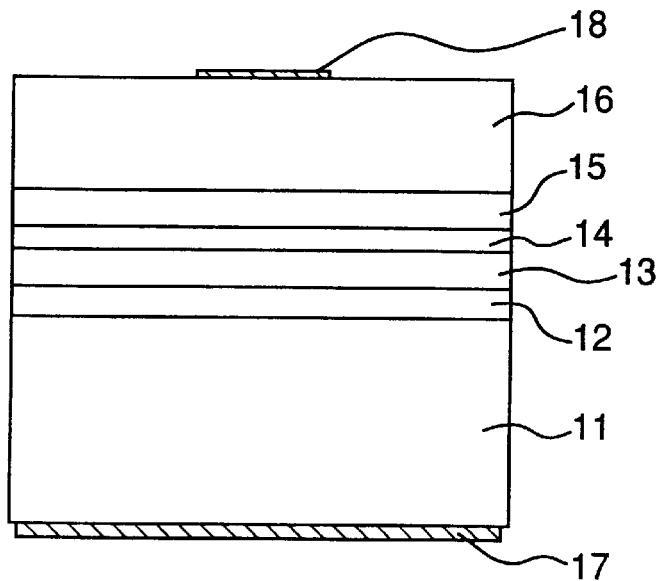
FIG. 3 is a structural view according to a second embodiment of the present invention.

FIG. 3 shows a cross-sectional structure of an AlGaInP family light emitting diode according to a second embodiment of the present invention. This light emitting diode is formed through the steps of: making an n-type InGaP buffer layer 12, a Si doped $(Al_xGa_{1-x})_{1-y}In_yP$ (x=1.0, y=0.51) clad layer 13, a Se.Mg doped $(Al_xGa_{1-x})_{1-y}In_yP$ (x=0.5, y=0.51) active layer 14 as a light emitting layer, a Zn doped $(Al_xGa_{1-x})_{1-y}In_yP$ (x=1.0, y=0.51) clad layer 15 and a Zn doped GaP current spreading layer 16 grown one after another on an n-type GaP substrate 11 having a plane tilted 15° from the (001) plane in the [110] direction, for example, by MOCVD (Metal Organic Chemical Vapor Deposition) process; and thereafter providing an n-side electrode 17 on the bottom surface of the GaP substrate 11 and a p-side electrode 18 on the top surface of the current spreading layer 16, respectively. Although a 15° off substrate 1 has been employed as in the first embodiment, a (100) plane just substrate also may do. The doping concentration of impurities into the $(Al_xGa_{1-x})_{1-y}In_yP$ material used as the base material of the active layer 14 is within a range of $1\times10^{17}$–$1\times10^{19}$ cm$^{-3}$ for Se as the first impurity that forms the donor level, and $1\times10^{17}$14 $1\times10^{18}$ cm$^{-3}$ for Mg as the second impurity that forms the acceptor level.

Figure 4A:
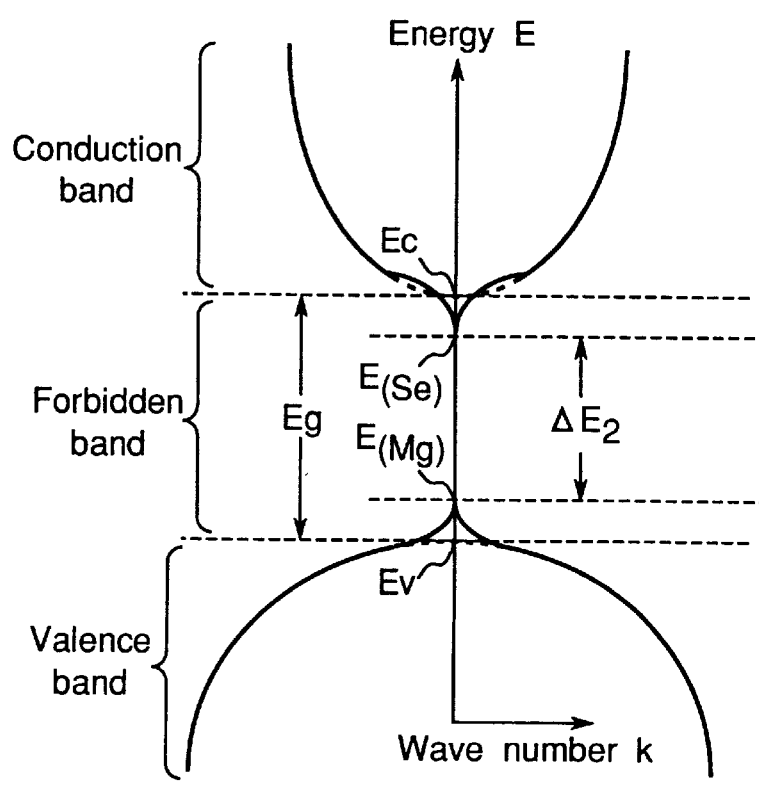
FIGS. 4A and 4B are a band state view and a view showing a state density distribution of carriers according to the second embodiment of the invention.
Figure 4B:
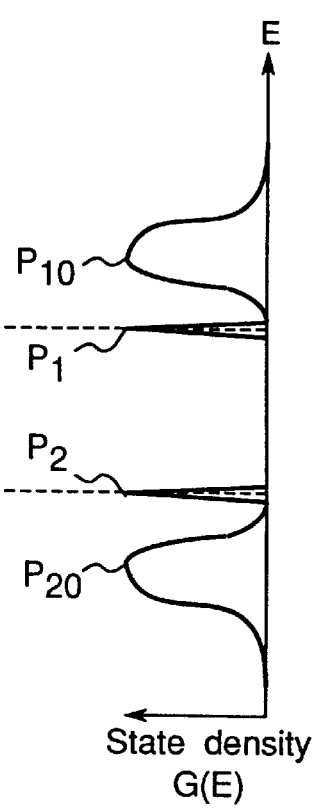

Since the $(Al_xGa_{1-x})_{1-y}In_yP$ materials 13, 14 and 15 are grown in a state of lattice mismatching on the GaP substrate 11, neither the vicinity of the bottom (energy value Ec) of the conduction band nor the vicinity of the top (energy value Ev) of the valence band of the active layer 14 would become parabolic but each of them has a tail of about several tens meV as shown in the energy band view of FIG. 4A, so that tip ends (not necessarily definite in position) of the tails fall away from peaks $P_{10}$, $P_{20}$ of the state density G(E) of carriers in the conduction band and the valence band as shown in FIG. 4B. For this reason, the transition probability of normal light emission at band ends is relatively small.

With this light emitting diode, however, in the active layer 14, Se as the first impurity forms a donor level $E_{(Se)}$ at a position 190 meV distant from the end (bottom) Ec of the conduction band of the base material $(Al_xGa_{1-x})_{1-y}In_yP$ (x=0.5, y=0.51), and Mg as the second impurity forms an acceptor level $E_{(Mg)}$ at a position 64 meV distant from the end (top) of the valence band of the base material $(Al_xGa_{1-x})_{1-y}In_yP$ (x=0.5, y=0.51) ($P_1$, $P_2$ in FIG. 4B show peaks of state density G(E) corresponding to these donor level $E_{(Se)}$ and acceptor level $E_{(Mg)}$, respectively). The donor level $E_{(Se)}$ formed by Se and the acceptor level $E_{(Mg)}$ formed by Mg are distant more than 30 meV from the band ends Ec and Ev, respectively, so that radiative recombination between the donor level $E_{(Se)}$ formed by Se and the acceptor level $E_{(Mg)}$ formed by Mg will hardly be affected by the tails. Also, since the donor level $E_{(Se)}$ formed by Se and the acceptor level $E_{(Mg)}$ formed by Mg are positioned within 200 meV from the band ends Ec and Ev, respectively, these Se and Mg will effectively work each as a radiative recombination center. Therefore, the internal quantum efficiency is enhanced by the radiative recombination between the donor level $E_{(Se)}$ formed by Se and the acceptor level $E_{(Mg)}$ formed by Mg. Although the active layer 14 emits light of a wavelength corresponding to an energy gap $\Delta E_2$ between the donor level $E_{(Se)}$ formed by Se and the acceptor level $E_{(Mg)}$ formed by Mg, the light emitted by the active layer 14 will substantially not be absorbed by the GaP substrate 11 (because the GaP substrate is transparent to the light emission wavelengths of AlGaInp materials, 650 nm–550 nm), so that the external quantum efficiency does not lower, either. Consequently, the light emission efficiency as a whole can be enhanced.

Actually, with the light emitting diode of this second embodiment, the emission light wavelength became 621 nm in response to an energy gap $\Delta E_2$=2.00 eV between the donor level $E_{(Se)}$ formed by Se and the acceptor level $E_{(Mg)}$ formed by Mg. In this case, a light emission efficiency of 4.5% was able to be obtained. In contrast to this, with the light emitting diode of lattice matching type in which AlGaInp materials are grown on a GaAs substrate as shown in FIG. 8, the emission light wavelength was 550 nm in response to a band gap Eg (=2.25 eV) with the mixed crystal ratios of x=0.5, y=0.51 of the non-doped $(Al_xGa_{1-x})_{1-y}In_yP$ active layer 210. In this case, the resulting light emission efficiency is 0.1%. Therefore, in a comparison with the same mixed crystal ratios x, y of the active layer, the light emitting diode having the structure of the second embodiment has found that the light emission efficiency can be enhanced forty-five-fold as compared with the light emitting diode of FIG. 8. Also, with the light emitting diode of lattice matching type in which AlGaInp materials are grown on a GaAs substrate as shown in FIG. 8, when the non-doped $(Al_xGa_{1-x})_{1-y}In_yP$ active layer 210 has mixed crystal ratios of x=0.08, y=0.51, the emission light wavelength is 635 nm correspondingly. In this case, the resulting light emission efficiency is 0.15%. Therefore, in a comparison on the condition of generally equal emission light wavelengths, the light emitting diode having the structure of the second embodiment has found that the light emission efficiency can be enhanced thirty-fold as compared with the light emitting diode of FIG. 8.

In addition, sulfur, tellurium or the like besides nitrogen and selenium may be used as the first impurity that forms the donor level, and cadmium besides zinc and magnesium may be used as the second impurity that forms the acceptor level.

Further, AlGaAs or the like may be used instead of GaP as the material of the current spreading layers 6, 16.

The light emitting diodes of the first and second embodiments have been provided as those of double hetero type with the active layer sandwiched by clad layers having a large energy gap. However, the present invention is not limited to that as a matter of course. The present invention can be widely applied to single hetero type light emitting diodes, homojunction type light emitting diodes and other semiconductor light emitting devices.

As apparent from the foregoing description, in this semiconductor light emitting device, on a semiconductor substrate is formed a light emitting layer that emits light of wavelengths which is not substantially absorbed by this semiconductor substrate in a state of lattice mismatching with the semiconductor substrate, and the impurity serving as a radiative recombination center forms an impurity level at a position distant from a band end in a forbidden band of a semiconductor material used as the base material of the light emitting layer. Therefore, even if the band end of the semiconductor material used as the base material of the light emitting layer has a tail due to the lattice mismatching with the semiconductor substrate, the radiative recombination through the impurity level is unlikely to be affected by the tail. As a result, the internal quantum efficiency is enhanced. Also, light emitted by the light emitting layer is not substantially absorbed by the semiconductor substrate, and the external quantum efficiency does not lower, either. Therefore, the light emission efficiency as a whole can be enhanced.

In the semiconductor light emitting device of an embodiment, since two kinds of impurities, a first impurity that forms a donor level and a second impurity that forms an acceptor level are used, radiative recombination occurs between the donor level formed by the first impurity and the acceptor level formed by the second impurity. Therefore, the internal quantum efficiency becomes higher than it is when only either one of the first impurity or the second impurity is doped, so that the light emission efficiency as a whole is further enhanced.

In the semiconductor light emitting device of an embodiment, the donor level formed by the first impurity is positioned within a range of 30 meV to 200 meV from the end of the conduction band of the semiconductor material used as the base material, and the acceptor level formed by the second impurity is positioned within a range of 30 meV to 200 meV from the end of the valence band of the semiconductor material used as the base material. Therefore, even if the end of the conduction band and the end of the valence band of the semiconductor material used as the base material each have a tail of about several tens meV due to the lattice mismatching between the semiconductor substrate and the light emitting layer, the radiative recombination between the donor level formed by the first impurity and the acceptor level formed by the second impurity is hardly affected by the tails. Also, these first and second impurities work effectively as radiative recombination centers, respectively. Accordingly, the internal quantum efficiency is further enhanced by the radiative recombination between the donor level formed by the first impurity and the acceptor level formed by the second impurity. As a consequence of this, the light emission efficiency as a whole can be further enhanced.

In the semiconductor light emitting device of the present invention, in which a light emitting layer including AlGaInP material as a base material is grown on a GaP substrate in a state of lattice mismatching with the GaP substrate, nitrogen, oxygen, selenium, sulfur or tellurium is doped as the first impurity that forms the donor level, and moreover magnesium, zinc or cadmium is doped as the second impurity that forms the acceptor level, in the AlGaInP material used as the base material of the light emitting layer. Therefore, nitrogen, oxygen, selenium, sulfur or tellurium as the first impurity forms the donor level within a range of 30 meV to 200 meV from the end of the conduction band of the AlGaInP material used as the base material, and magnesium, zinc or cadmium as the second impurity forms the acceptor level within a range of 30 meV to 200 meV from the end of the valence band of the AlGaInP material used as the base material. As a result, even if the end of the conduction band and the end of the valence band of the AlGaInP material used as the base material each have a tail of about several tens meV due to the lattice mismatching between the GaP substrate and the light emitting layer, the radiative recombination between the donor level formed by the first impurity and the acceptor level formed by the second impurity is hardly affected by the tails. Also, these first and second impurities work effectively as radiative recombination centers, respectively. Accordingly, the internal quantum efficiency is enhanced by the radiative recombination between the donor level formed by the first impurity and the acceptor level formed by the second impurity. Further, light of wavelengths from red to green emitted by the light emitting layer responsive to the energy gap between the donor level formed by the first impurity and the acceptor level formed by the second impurity is not substantially absorbed by the GaP substrate, so that the external quantum efficiency does not lower, either. Consequently, the light emission efficiency as a whole is enhanced, and light emission of high brightness can be obtained in the wavelength band of red to green.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. A semiconductor light emitting device in which a light emitting layer that emits light of wavelengths which are not substantially absorbed by a semiconductor substrate is formed on the semiconductor substrate in a state of lattice mismatching with the semiconductor substrate, characterized in that a semiconductor material used as a base material of the light emitting layer is doped with at least one impurity serving as a radiative recombination center.

2. The semiconductor light emitting device according to claim 1, wherein the light emitting layer is doped with a first impurity for forming a donor level and a second impurity for forming an acceptor level.

3. The semiconductor light emitting device according to claim 2, wherein the donor level formed by the first impurity is positioned within a range of 30 meV to 200 meV from an end of a conduction band of the semiconductor material used as the base material, and the acceptor level formed by the second impurity is positioned within a range of 30 meV to 200 meV from an end of a valence band of the semiconductor material used as the base material.

4. The semiconductor light emitting device according to claim 2, wherein a doping concentration of the first impurity is within a range of $1\times10^{17}$ cm$^{-3}$ to $1\times10^{19}$ cm$^{-3}$ and a doping concentration of the second impurity is within a range of $1\times10^{17}$ cm$^{-3}$ to $1\times10^{18}$ cm$^{-3}$.

5. The semiconductor light emitting device according to claim 1, wherein said semiconductor light emitting device is of the double hetero type.

6. The semiconductor light emitting device according claim 1, wherein the semiconductor material used as the base material comprises $(Al_xGa_{1-x})_{1-y}In_yP$, wherein $0\leq x$, $y\leq 1$.

7. The semiconductor light emitting device according to claim 6, wherein y=0.51 and x is in a range from 0 to 0.7.

8. A semiconductor light emitting device in which a light emitting layer including an AlGaInP material as a base material is grown on a GaP substrate in a state of lattice mismatching with the GaP substrate, characterized in that the AlGaInP material used as the base material of the light emitting layer is doped with nitrogen, oxygen, selenium, sulfur or tellurium as a first impurity for forming a donor level, and magnesium, zinc or cadmium as a second impurity for forming an acceptor level.

9. The semiconductor light emitting device according to claim 8, wherein a doping concentration of the first impurity is within a range of $1\times10^{17}$ cm$^{-3}$ to $1\times10^{19}$ cm$^{-3}$ and a doping concentration of the second impurity is within a range of $1\times10^{17}$ cm$^{-3}$ to $1\times10^{18}$ cm$^{-3}$.

10. The semiconductor light emitting device according to claim 8, wherein said semiconductor light emitting device is of the double hetero type.

11. A semiconductor light emitting device, comprising:

a semiconductor substrate; and a light emitting layer formed on said semiconductor substrate, said semiconductor substrate being substantially transparent to light emitted by said light emitting layer, and said semiconductor substrate and said light emitting layer having non-matching lattice constants, wherein a semiconductor material of said light emitting layer is doped with at least one impurity that provides a radiation recombination center at an energy level spaced from the conduction band or the valence band of the semiconductor material of said light emitting layer.

12. The semiconductor light emitting device according to claim 11, wherein the semiconductor material of said light emitting layer comprises $(Al_xGa_{1-x})_{1-y}In_yP$, wherein $0\leq x$, $y\leq 1$.

13. The semiconductor light emitting device according to claim 12, wherein y=0.51 and x is in a range from 0 to 0.7.

14. The semiconductor light emitting device according to claim 11, further comprising:

first and second clad layers respectively arranged above and below said light emitting layer, said first and second clad layers having lattice constants that are non-matching with respect to said semiconductor substrate.

15. A semiconductor light emitting device, comprising:

a semiconductor substrate; and a light emitting layer formed on said semiconductor substrate, said semiconductor substrate being substantially transparent to light emitted by said light emitting layer, and said semiconductor substrate and said light emitting layer having non-matching lattice constants, wherein a semiconductor material of said light emitting layer is doped with a first impurity that provides a radiation recombination center at an energy level spaced from the conduction band of the semiconductor material of said light emitting layer and a second impurity that provides a radiation recombination center at an energy level spaced from the valence band of the semiconductor material of said light emitting layer.

16. The semiconductor light emitting device according to claim 15, wherein the first impurity is one selected from the group consisting of nitrogen, -oxygen, selenium, sulfur and tellurium and the second impurity is one selected from the group consisting of magnesium, zinc and cadmium.

17. The semiconductor light emitting device according to claim 15, wherein the radiation recombination center provided by the first impurity is at an energy level spaced between 30 and 200 meV from the conduction band of the semiconductor material of said light emitting layer and the radiation recombination center provided by the second impurity is at an energy level spaced between 30 and 200 meV from the valence band of the semiconductor material of the light emitting layer.

18. The semiconductor light emitting device according to claim 15, wherein a doping concentration of the first impurity is within a range of $1\times10^{17}$ cm$^{-3}$ to $1\times10^{19}$ cm$^{-3}$ and a doping concentration of the second impurity is within a range of $1\times10^{17}$ cm$^{-3}$ to $1\times10^{18}$ cm$^{-3}$.

19. The semiconductor light emitting device according to claim 15, wherein said semiconductor substrate comprises GaP.

20. The semiconductor light emitting device according to claim 15, wherein said semiconductor substrate comprises GaP and the semiconductor material of said light emitting layer comprises $(Al_xGa_{1-x})_{1-y}In_yP$, wherein $0\leq x$, $y\leq 1$.

* * * * *